(12) United States Patent
Liao et al.

(10) Patent No.: US 6,777,309 B1
(45) Date of Patent: Aug. 17, 2004

(54) METHOD FOR FABRICATING THIN FILM TRANSISTOR DISPLAY DEVICE

(75) Inventors: Tsung-Neng Liao, Taichung Hsien (TW); Yuan-Tung Dai, Chung-Li (TW); Chun-Chi Lee, Taipei (TW)

(73) Assignee: Gem Line Technology Co., Ltd., Tainan Hsien (TW)

( * ) Notice: Subject to any disclaimer, the term of this patent is extended or adjusted under 35 U.S.C. 154(b) by 0 days.

(21) Appl. No.: 10/353,180

(22) Filed: Jan. 28, 2003

(51) Int. Cl.[7] .............................................. H01L 21/30
(52) U.S. Cl. ........................................ 438/458; 149/45
(58) Field of Search ........................... 438/27, 29, 149, 438/155, 455, 458, 464; 149/42–43, 45, 47, 52

(56) References Cited

U.S. PATENT DOCUMENTS 5,317,236 A * 5/1994 Zavracky et al. ............. 438/27
6,521,511 B1 * 2/2003 Inoue et al. ................. 438/458
6,559,905 B1 * 5/2003 Akiyama ..................... 349/45

* cited by examiner

*Primary Examiner*—David Nelms
*Assistant Examiner*—David Vu
(74) *Attorney, Agent, or Firm*—William E. Pelton, Esq.

(57) ABSTRACT

The present invention makes it possible to transfer thin film devices such as integrated semiconductor and optical components from a first substrate onto a second substrate through a thermal process at high temperature, without degradation of device performance. Other devices can be fabricated thereafter on the other side of the second substrate. Since the semiconductor and optical components can be transferred onto the second substrate in a single-step thermal process, in comparison with prior art the number of transfer substrates needed in the fabrication process can be effectively reduced, thus simplifying the fabrication process and realizing cost reduction.

24 Claims, 13 Drawing Sheets

METHOD FOR FABRICATING THIN FILM TRANSISTOR DISPLAY DEVICE

BACKGROUND OF THE INVENTION

1. Field of the Invention

The present invention relates to the method for fabricating thin film transistor display device that possesses the advantages of planarized surface on the pixel region, simplified fabrication process and enhanced production yield.

2. Description of Related Arts

The transfer fabrication process enables thin film devices to be created on substrates which would otherwise be impossible with the present semiconductor fabrication technique. A thin film transistor display device is fabricated through a transfer process, which claims to possess good device performance after transferring a semiconductor component onto a plastic substrate.

With reference to FIGS. 12A~F, a semiconductor component is fabricated through a series of steps: providing a first transfer substrate (50); forming a sacrificial layer (501) on top of the first transfer substrate (50); forming a thermal insulation layer (51) over the sacrificial layer (501); forming a semiconductor film (52) over the thermal insulation layer (51); forming a first dielectric layer (53) over the semiconductor film (52); forming a gate electrode layer (56) over the first dielectric layer (53), thus completing the fabrication of a semiconductor component on the first substrate (50).

Afterwards, the semiconductor component is integrated with a transparent electrode layer to form an integrated driver circuit through a series of steps: forming a second dielectric layer (54) over the semiconductor component; forming a first passivation layer (55) over the second dielectric layer (54); forming a transparent electrode layer (57) on top the first passivation layer (55), where the transparent electrode (57) is connected to the semiconductor component after patterning as shown in FIG. 12A; forming a second passivation layer (60) over the first passivation layer (55) and the transparent electrode (57); bonding a supporting substrate (61) onto the second passivation layer (60) as shown in FIG. 12B.

Then, a second substrate (70) is glued on top of the semiconductor component, as shown in FIG. 12E, for transferring the semiconductor component from the first substrate (50) to the second substrate (70); heat is applied on the sacrificial layer (501) through laser irradiation to cause the sacrificial layer (501) to crack when an hydrogen explosion occurs on the inner surface of the first substrate (50) and the semiconductor component will detach from the surface of the first substrate (50) as shown in FIGS. 12 C & D (Since the sacrificial layer (501) is made with non-crystalline silicon film carrying hydrogen atoms, the laser beam creates thermal heat raising the internal temperature, and causes a hydrogen explosion in the thermal process); finally, the supporting substrate (61) and the second passivation layer (60) are removed to expose the transparent electrode (57) as shown in FIG. 12F.

The above process involves pre-forming of the semiconductor component over the first transfer substrate (50) and then transferring the semiconductor component from the first substrate (50) onto the second substrate (70) through a thermal process. The semiconductor component to be created on the first substrate can be thin film transistor (TFT), metal oxide semiconductor (MOS), metal insulator metal capacitor (MIM) or thin film diode (TFD). However, the above fabrication process still has several shortcomings:

Too many transfer substrates: from the formation of the semiconductor component to the successful transfer of the semiconductor component onto the final substrate, at least three transfer substrates are needed.

Complex process and high process costs: using so many substrates in the process also entails complex processing steps, and furthermore the support substrate and the temporary protective layer will be discarded after one-time use in the thermal process. The above process is only part of the complete process which should further include the steps of forming the optical component and aligning the semiconductor component and the optical component.

Raised surface on the pixel electrode: since the pixel electrodes are formed under high temperature, the raised surface layer will cause uncontrolled electric discharge at the pointed edges resulting in abnormal white points on the display screen.

The fabrication process for thin film transistor display devices can be further improved to simplify the process and lower the process costs.

SUMMARY OF THE INVENTION

The main object of the present invention is to provide a method for fabricating thin film transistor display device by an economical means, whereby an integrated driver circuit with both the semiconductor component and the optical component can be successfully transferred from a first substrate onto a second substrate through a one-time thermal process, without degradation of device performance and consuming no substrates in the process. Since the semiconductor component and the optical component are formed and integrated on the first substrate before the transfer process, there is no need of further alignment. Also, the fully planarized surface of the pixel electrode can enhance the quality of display image.

The fabricating process comprises the steps of:

forming a pixel electrode directly over the sacrificial layer of the first substrate;

forming a semiconductor component on top of the pixel electrode layer;

performing testing on the semiconductor component to confirm the electrical characteristics;

forming an optical component, where the materials can be color conversion materials, filtering lens, polarizing film, light enhancing film, diffusion film, angle focusing film, wide angle lens, anti-reflection and reflection film, light absorption film, or a combination of the above, over the semiconductor component, thus forming an integrated driver circuit made up of a semiconductor component and an optical component on the same surface of the first substrate;

providing a second substrate for gluing onto the optical component on the first substrate;

applying heat on the back side of the first substrate to cause the surface of the sacrificial layer to crack and the semiconductor component and optical component to detach from the first substrate in a thermal process; and etching away the pixel electrode originally formed on the first substrate to expose the pixel region, thus completing the fabrication of the thin film transistor display device.

Since the semiconductor component and the optical component are fully integrated on the first substrate before the thermal process, there is no need of further alignment of the two components after successful transfer onto the second substrate. It can also be observed that the pixel region electrodes fully planarized to produce good display images. No protective layer and supporting substrate are used in the whole process, thus simplifying the fabrication and reducing the process costs.

The features and structure of the present invention will be more clearly understood when taken in conjunction with the accompanying drawings.

DETAILED DESCRIPTION OF THE PREFERRED EMBODIMENT

Figure 1:
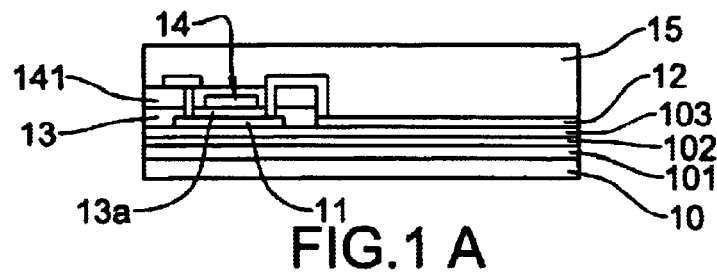
FIGS. 1A–1F represent the fabrication process for a thin film transistor display device in accordance with the first embodiment of the invention.
Figure 1:
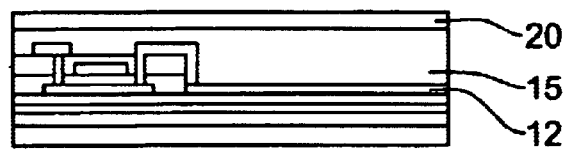
Figure 1:
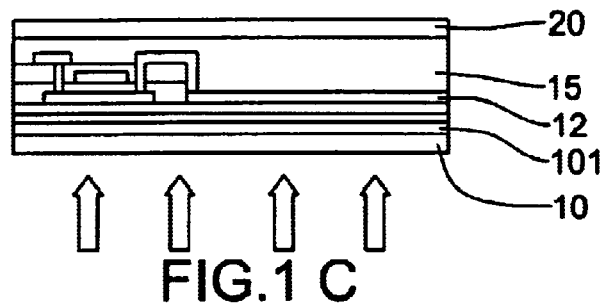
Figure 1:
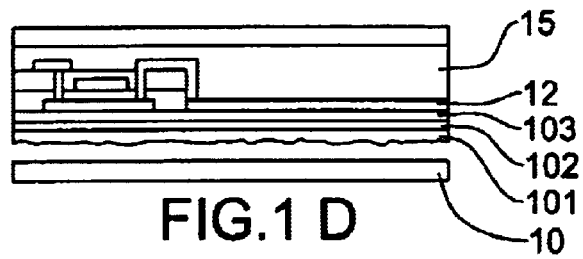
Figure 1:
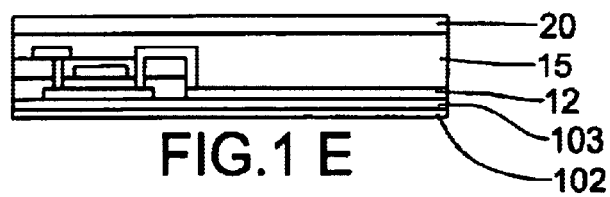
Figure 1:
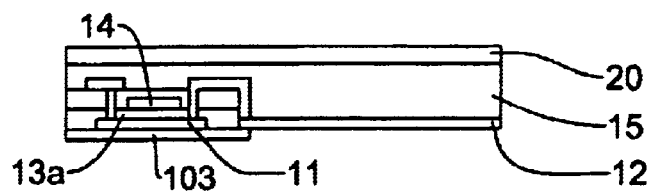

The present invention enables the transfer of a thin film device such as an integrated semiconductor and an optical component from the original substrate onto a second substrate through a hydrogen thermal process using an economical means, without degradation of device performance.

FIGS. 1A–1F show the fabrication process for a thin film transistor display device as practiced in the first embodiment of the invention, which includes the steps of:

providing a first substrate (10), which can be made of silicon, plastic, glass, or quartz;

forming a sacrificial layer (101) over the first substrate (10), wherein the sacrificial layer (101) is made from amorphous silicon material, containing many hydrogen atoms to cause combustion under high temperature;

forming an etching stop layer (102) over the sacrificial layer (101) for protection of a semiconductor component in etching and polishing processes, wherein the etching stop layer (102) can be made from materials such as silicon nitride, silicon oxide, diamond or diamond-like carbon materials;

forming a passivation layer (103) over the etching stop layer (102);

forming a semiconductor film (11) over the passivation layer (103);

patterning the semiconductor film (11) over the passivation layer (103) to define the active region, and ion doping to define a source and a drain region for the semiconductor component;

forming a first dielectric layer (13) is formed over the passivation layer (103) and the semiconductor film (11), patterning the first dielectric layer (13) to create a gate insulating layer (13a) corresponding to a gate electrode (14) to be described below;

forming a gate electrode layer (14) over the gate insulating layer (13);

forming a second dielectric layer (141) over the gate electrode layer (14);

forming a pixel electrode layer (12) over the passivation layer (103);

connecting the pixel electrode layer (12) to the semiconductor film (11);

forming an optical component layer (15) using materials such as color resist, wide viewing angle layer, organic light emitting diode, polymer light emitting diode, polarizing film, light enhancing film, angle focusing film, compensation film, anti-reflection film, light absorption film, or a combination of the above;

bonding a second substrate (20) overlying the optical component (15) originally created on top the first substrate (10), which can be implemented by means of direct bonding, anodic bonding, lower temperature bonding, intermediate bonding, adhesive bonding, or laser melting, where the bonding can be performed partially or selectively as shown in FIG. 1B;

applying heat on the back side of the first substrate (10) or over selected portions using the high temperature laser annealing or pulse type fast annealing technique to cause the sacrificial layer (101) over the first substrate (10) to crack when a hydrogen explosion occurs on the inner surface of the sacrificial layer (101), as shown in FIG. 1C, such that the sacrificial layer (101) is cracked and the semiconductor and optical components become detached for transferring onto the second substrate (20) as shown in FIGS. 1D & E;

removing the etching stop layer (102);

patterning the passivation layer (103) leaving only the portion to correspond to the semiconductor component, such that the planarized pixel electrode (12) can be exposed as shown in FIG. 1F.

The fabrication processes for the thin film transistor will be slightly modified in the following seven embodiments to be described below:

In the first embodiment, the materials for fabricating semiconductor component can be thin film transistor (TFT), metal oxide semiconductor (MOS), metal insulator metal capacitor (MIM), or thin film diode (TFD) built on top of a substrate made from amorphous silicon (a-Si) or glass materials through crystallization. After the semiconductor component, that is the thin film transistor, is formed, the optical component matching the particular requirements for a display monitor is coupled onto the semiconductor component to form an integrated driver circuit. With a single-step thermal process, the integrated semiconductor and optical component is transferred from the first substrate (10) onto the second substrate (20), with no need of further alignment for these two components. Since the pixel electrode (12) is formed directly over the first substrate (10), the pixel electrode (12) already possesses a fully planarized surface after the removal of the first substrate (10).

Figure 2:
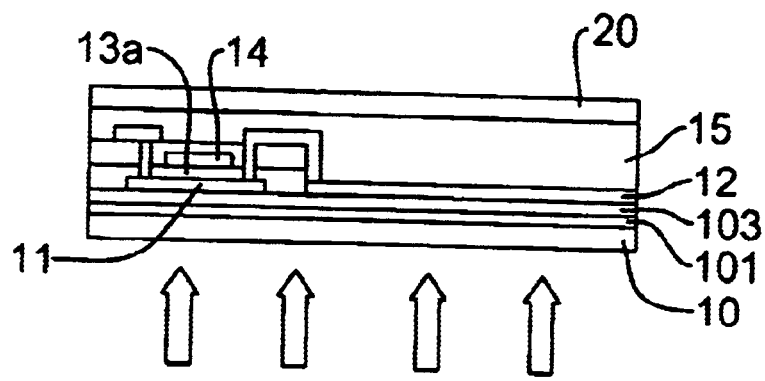
FIGS. 2A–2C represent the fabrication process for a thin film transistor display device in accordance with the second embodiment of the invention.
Figure 2:
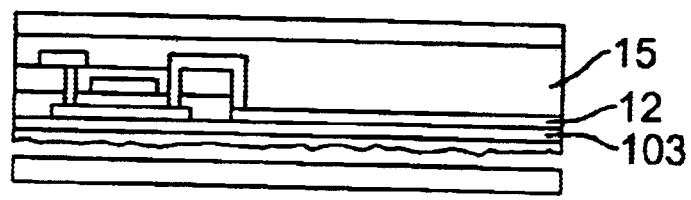
Figure 2:
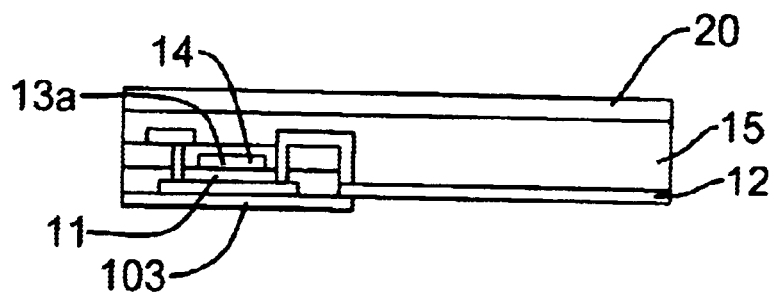

FIGS. 2A~C schematically illustrate the fabrication of the thin film transistor display device as practiced by the second embodiment of the invention. The process is basically identical to that employed by the first embodiment, with the exception that the sacrificial layer (101) and the passivation layer (103) are respectively formed over the first substrate (10), replacing the etching stop layer (not shown in the diagram). When the semiconductor component and optical components are detached from the first substrate (10), it only takes a patterning process on the passivation layer (103) to expose the pixel electrode (12).

Figure 3:
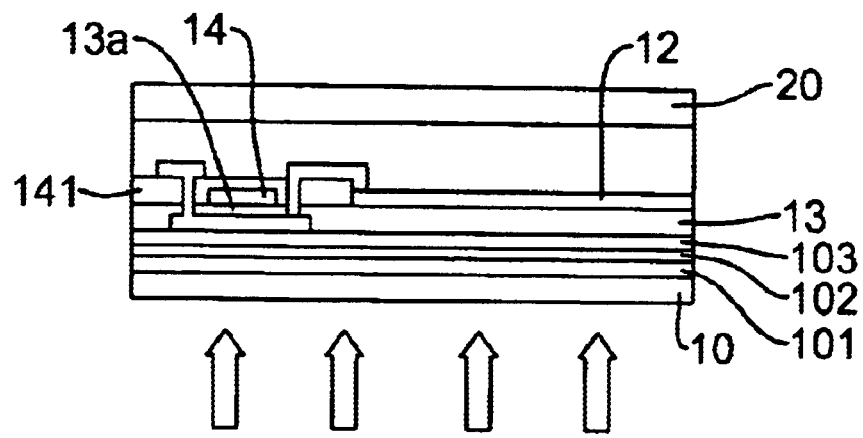
FIGS. 3A–3C represent the fabrication process for a thin film transistor display device in accordance with the third embodiment of the invention.
Figure 3:
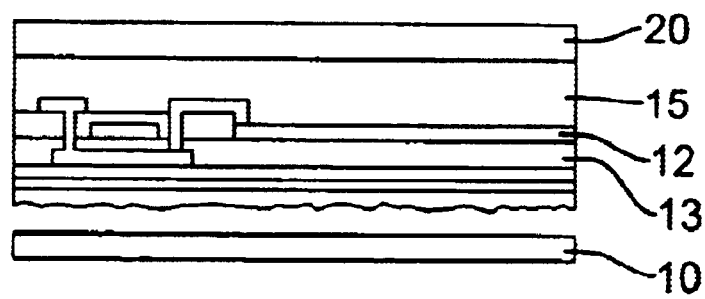
Figure 3:
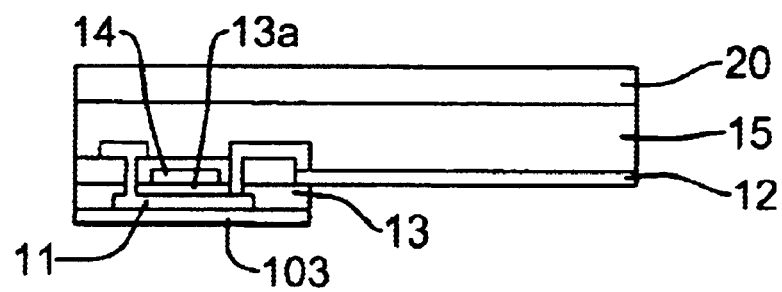

FIGS. 3A~C schematically illustrate the fabrication of thin film transistor display device as practiced by the third embodiment of the invention. The process is basically identical to that in the first embodiment, with the exception that etching back is not needed on the first dielectric layer (13) in forming the gate insulating layer (13a), and the pixel electrode (12) is directly formed on the first transparent dielectric layer (13). Lithography is respectively performed on the etching stop layer (102), passivation layer (103), and the first transparent dielectric layer (13) to expose the pixel electrode (12).

Figure 4:
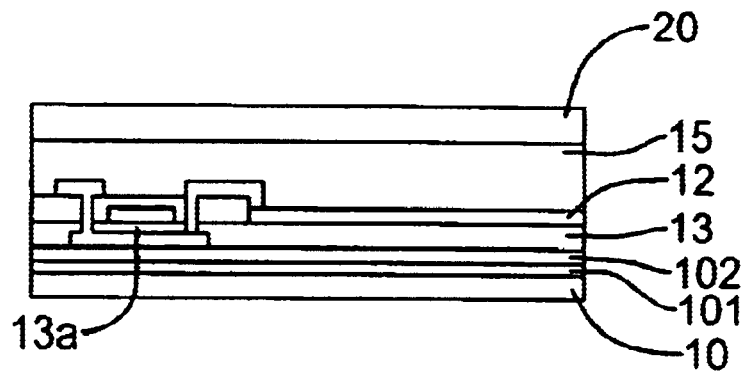
FIGS. 4A–4C represent the fabrication process for a thin film transistor display device in accordance with the fourth embodiment of the invention.
Figure 4:
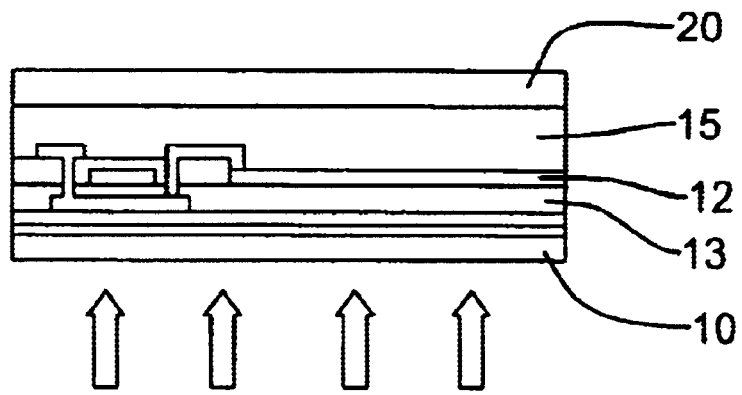
Figure 4:
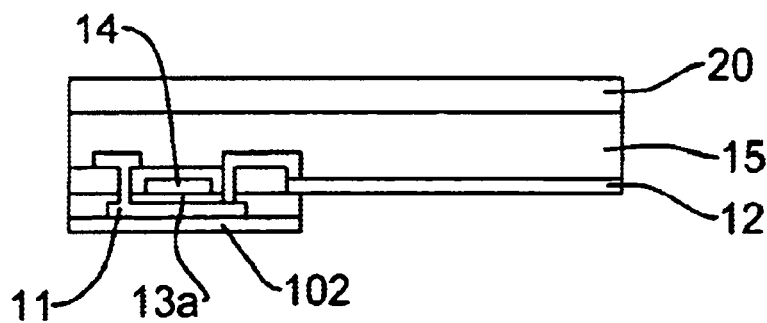

FIGS. 4A~C schematically illustrate the thin film transistor display device as practiced by the fourth embodiment of the invention, wherein the features of the second and third embodiments are all incorporated in this embodiment, that means it does not need the passivation layer (not shown in the diagram), and the pixel electrode layer (12) is formed on top of the first dielectric layer (13).

Figure 5:
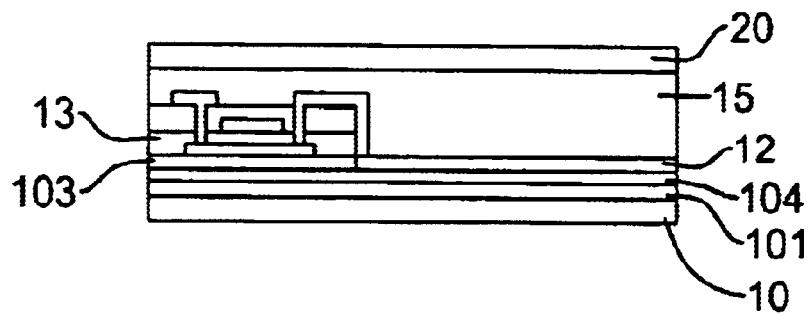
FIGS. 5A–5C represent the fabrication process for a thin film transistor display device in accordance with the fifth embodiment of the invention.
Figure 5B:
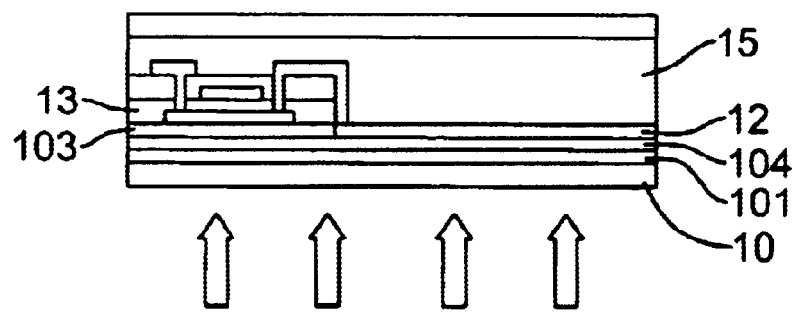
Figure 5:
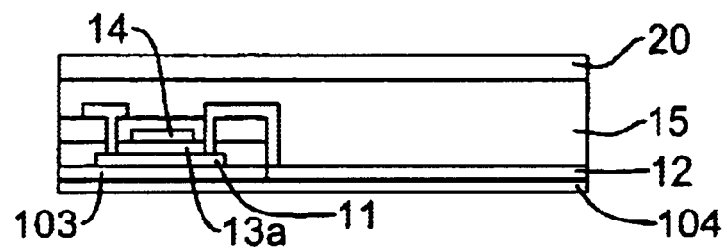

FIGS. 5A~C schematically illustrate the thin film transistor display device as practiced by the fifth embodiment of the invention, wherein the fabrication process is basically identical to that of the first embodiment, with the exception that the sacrificial layer (101), an alignment layer (104) and the passivation layer (103) are respectively formed over the first substrate (10), wherein the pixel electrode (12) is formed over the alignment layer (104).

Figure 6:
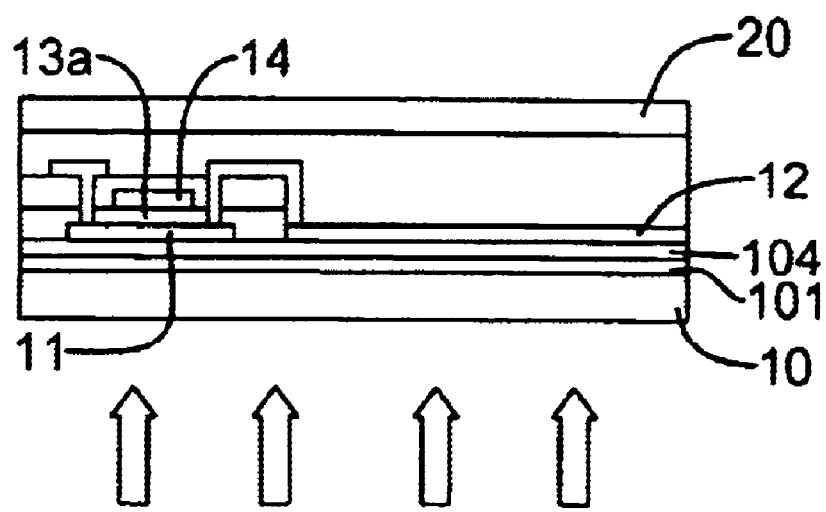
FIGS. 6A and 6B represent the fabrication process for a thin film transistor display device in accordance with the sixth embodiment of the invention.
Figure 6:
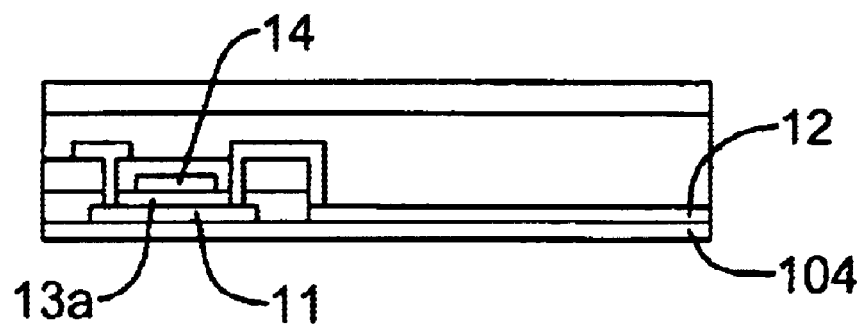

FIGS. 6A and 6B schematically illustrate the fabrication process of thin film transistor display device practiced by the sixth embodiment of the invention, wherein the fabrication process is basically identical to that of the first embodiment, with the exception that only the sacrificial layer (101) and the alignment layer (104) are respectively formed over the first substrate (10), and the pixel electrode (12) is formed over the alignment layer (104).

Figure 7:
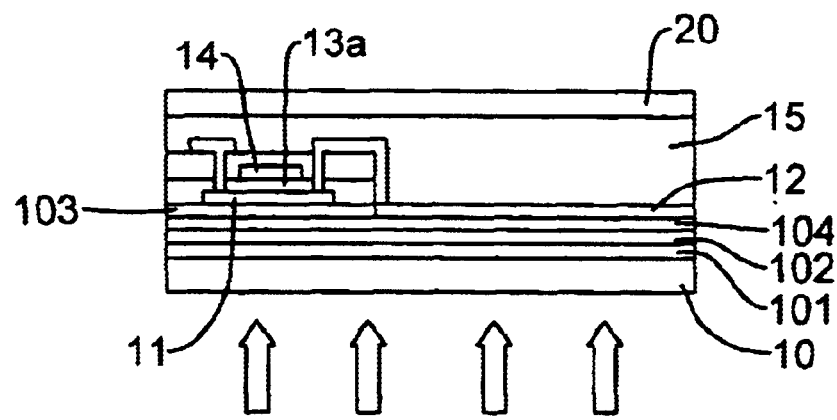
FIGS. 7A–7C represent the fabrication process for a thin film transistor display device in accordance with the seventh embodiment of the invention.
Figure 7:
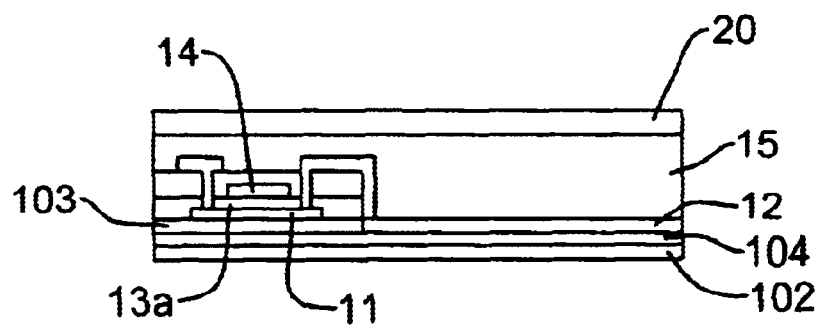
Figure 7:
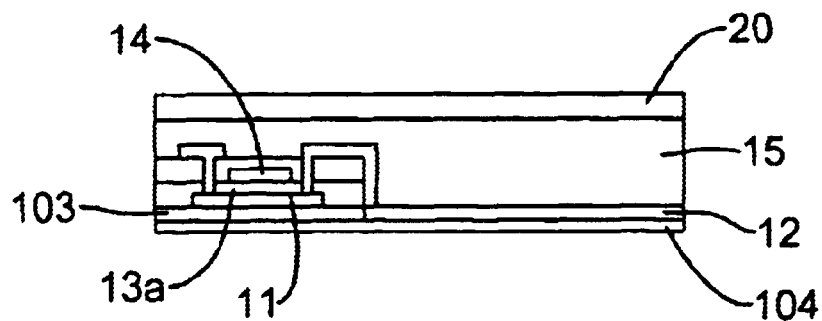

FIGS. 7A~7C schematically illustrate the fabrication of the thin film transistor display device as practiced by the seventh embodiment of the invention. The fabrication process is basically identical to that of the first embodiment, with the exception that the sacrificial layer (101), the etching stop layer (102), the alignment layer (104), and the patterned passivation layer (103) are respectively formed on top of the first substrate (10), and the pixel electrode (12) is formed over the alignment layer (104).

Figure 8:
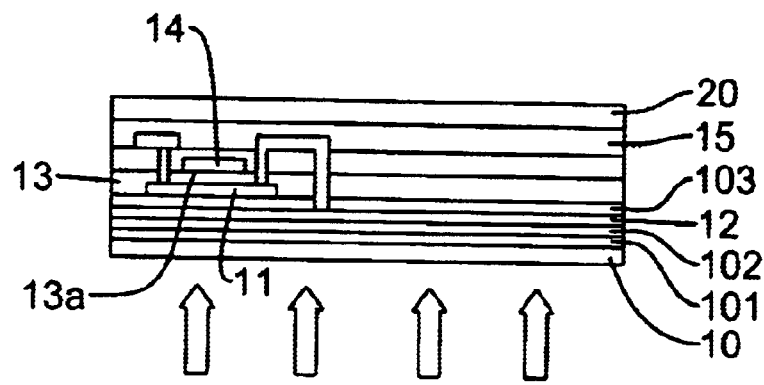
FIGS. 8A–8C represent the fabrication process for a thin film transistor display device in accordance with the eighth embodiment of the invention.
Figure 8:
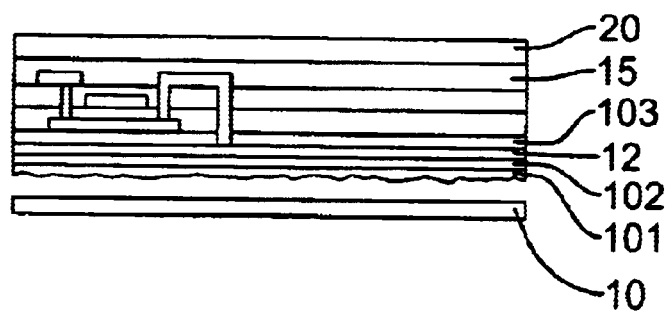
Figure 8:
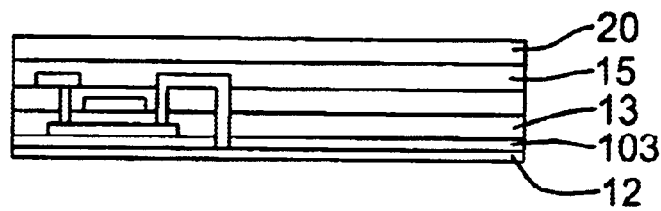

Still another variation on the fabrication process for the thin film transistor display device is different from those described above in that some of the processing steps are carried out in the reverse order; that is the pixel electrode (12) is formed on top of the first substrate (10) before the formation of the thin film transistor. Referring to FIGS. 8A~8C, a sacrificial layer (101) is first formed on top of the first substrate (10), then a etching stop layer (102) is formed over the sacrificial layer (101), then a pixel electrode layer (12) is formed over the etching stop layer (102), and then a passivation layer (103) is formed over the pixel electrode layer (12) for fabrication of thin film transistor over the passivation layer (103). After successful testing of the electrical characteristics of the semiconductor component, the formation of an optical component (15), the transfer process and the lithography process are respectively performed to produce the thin film transistor display device.

Figure 9:
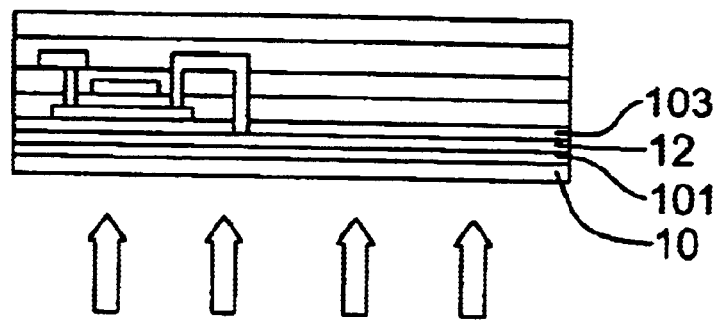
FIGS. 9A–9C represent the fabrication process for a thin film transistor display device in accordance with the ninth embodiment of the invention.
Figure 9:
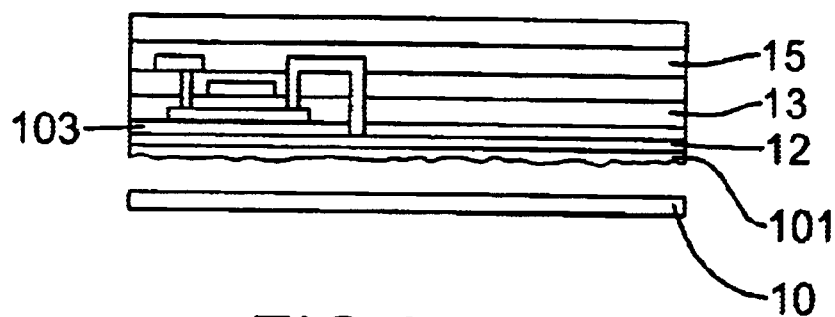
Figure 9:
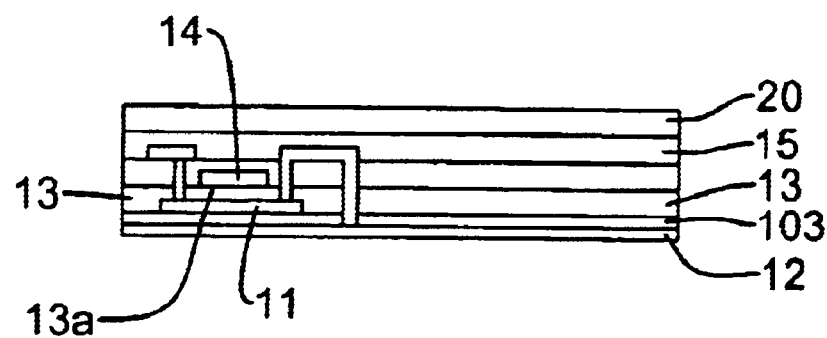
Figure 10:
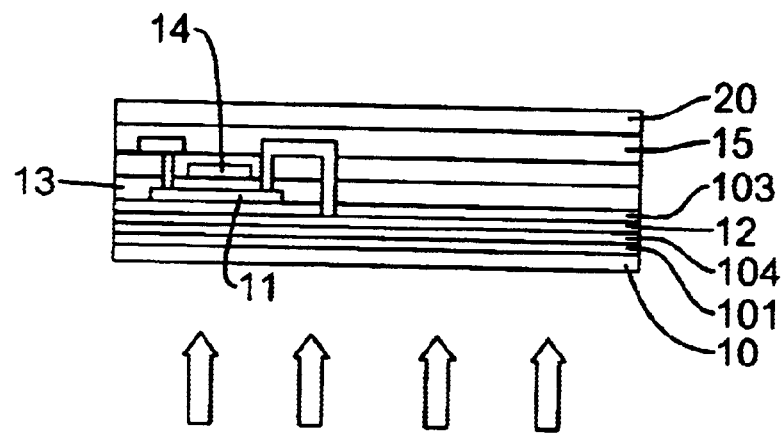
FIGS. 10A–10C represent the fabrication process for a thin film transistor display device in accordance with the tenth embodiment of the invention.
Figure 10:
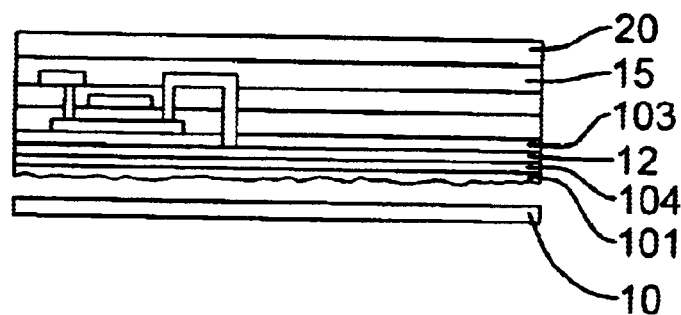
Figure 10:
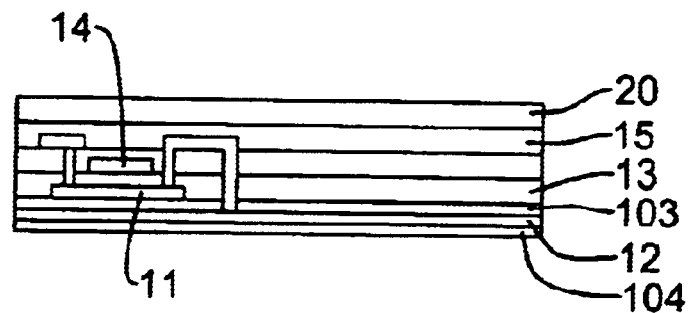
Figure 11:
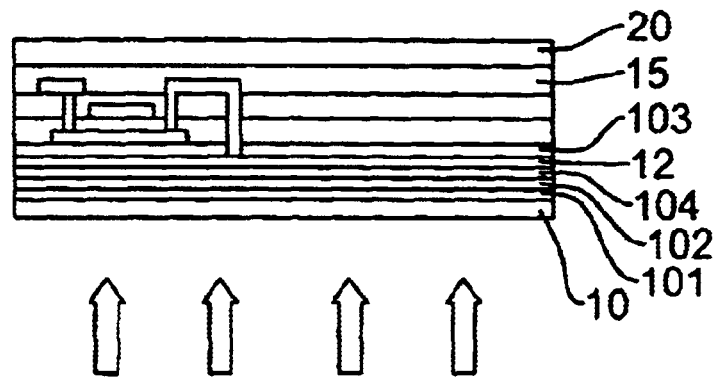
FIGS. 11A–11C represent the fabrication process for a thin film transistor display device in accordance with the eleventh embodiment of the invention.
Figure 11:
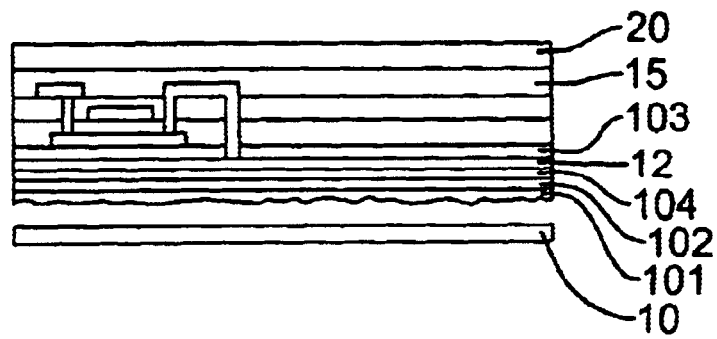
Figure 11:
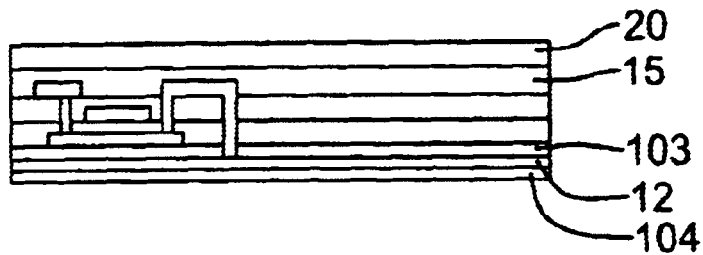
Figure 12:
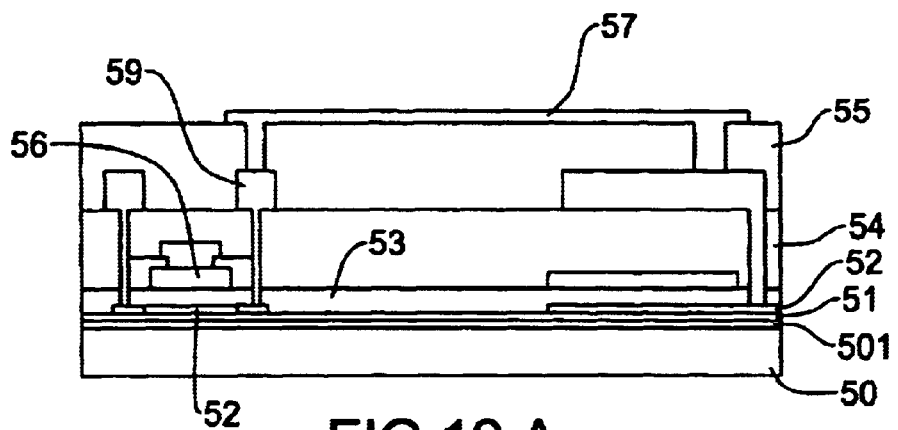
FIGS. 12A–12F represent the fabrication process for a thin film transistor display device in the prior art, only showing the part for the semiconductor component.
Figure 12:
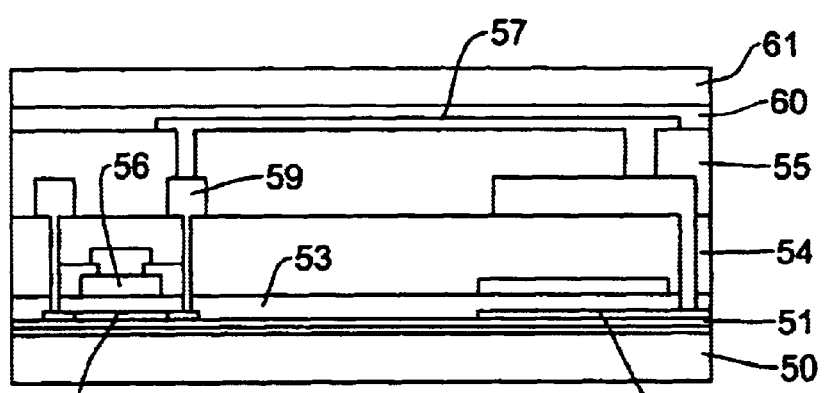
Figure 12:
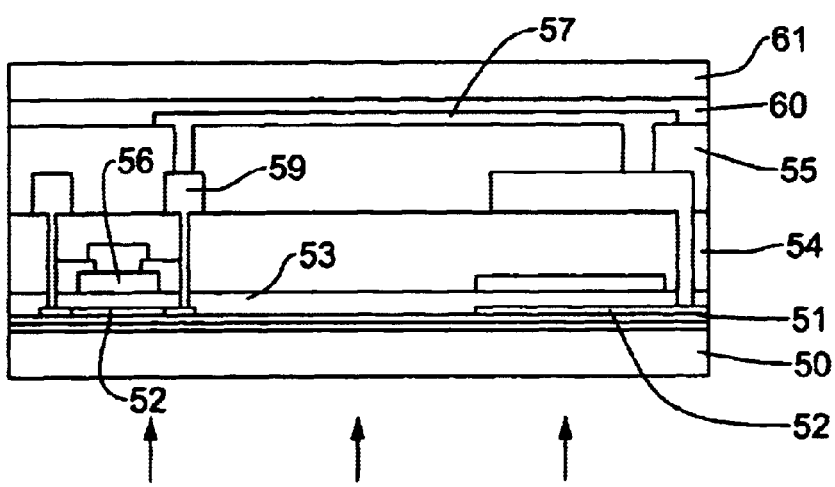
Figure 12:
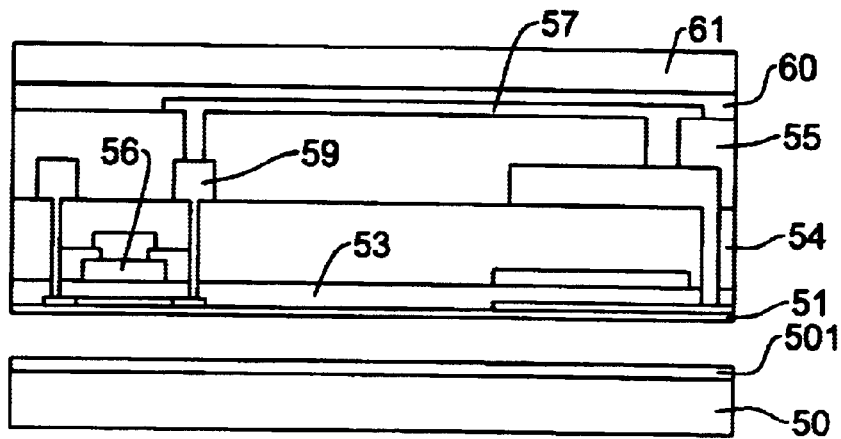
Figure 12:
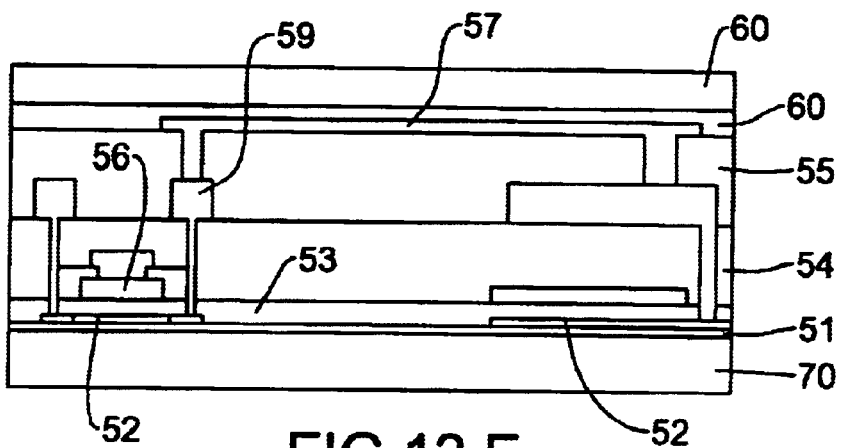
Figure 12:
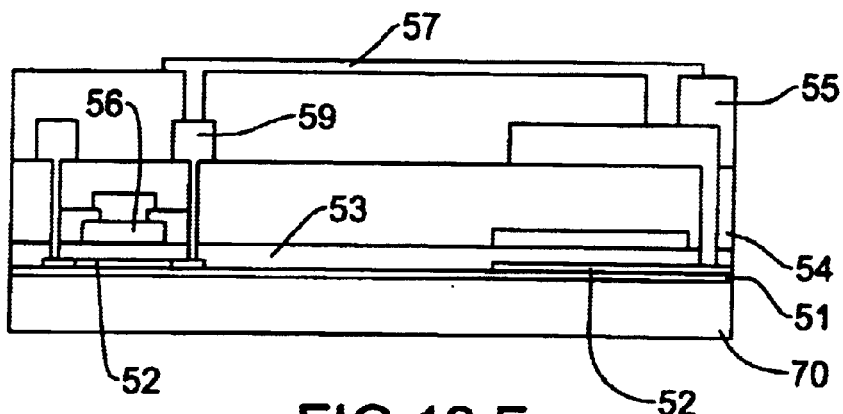

FIGS. 9A~9C schematically illustrate the fabrication of the thin film transistor display device as practiced by the ninth embodiment of the invention. The process is slightly different from the eighth embodiment in that it does not need the etching stop layer (not shown in the diagram). Referring to FIGS. 10A~10C, the fabrication process as practiced by the tenth embodiment of the invention is different from the eighth embodiment in that an alignment layer (104) is used instead of the etching stop layer (102); or else, it could also be implemented by forming a alignment layer (104) directly over the etching stop layer (102) as shown in FIGS. 11A~11C.

The present invention is characterized in that the semiconductor component and optical component are fully integrated on the first substrate with no need of further alignment in subsequent process.

The present invention is also characterized in that thin film device possesses good electrical and optical characteristics without degradation of device performance after the transfer process, and the first substrate can be used again with no waste of substrates.

The present invention is also characterized in that the pixel electrode is formed in the semiconductor fabrication process and connected internally to the semiconductor component, such that the semiconductor component can be directly exposed after the transfer process as disclosed in the previous embodiment; alternatively, through patterning of the sacrificial layer and the passivation layer the semiconductor component becomes exposed with a planarized surface, with no need of further patterning for the pixel electrode. This facilitates the filling of light materials such as liquid crystal, organic light emitting diode (OLED) or polymer light emitting diode (PLED) to produce a good display quality.

In sum, the present invention is performed with two transfer substrates; the semiconductor component and the optical component are formed and integrated on the same substrate, and through one-time thermal process the integrated device is transferred to the second substrate without degradation of device performance; the original transfer substrate where the semiconductor and optical component are initially formed can be reused, as opposed to the conventional thermal process which requires at least three substrates.

The foregoing description of the preferred embodiments of the present invention is intended to be illustrative only and, under no circumstances, should the scope of the present invention be so restricted.

What is claimed is:

1. A method for fabricating a thin film transistor display device includes the formation of a semiconductor component layer and a pixel electrode layer on the surface of a first transfer substrate being coated with a sacrificial layer on the surface, then the formation of an optical component layer over the semiconductor component layer and the pixel electrode layer, then bonding of a second transfer substrate on top of the optical component for transferring semiconductor component and optical component over the first transfer substrate to the second substrate in a thermal process, and subsequent patterning to expose the pixel electrode.

2. The method for fabricating a thin film transistor display device as claimed in claim 1, wherein the fabrication process comprises the steps of:

providing the first transfer substrate;

forming a sacrificial layer on top of the first transfer substrate;

forming a passivation layer over the sacrificial layer;

forming a semiconductor film over the passivation layer; wherein the semiconductor film is ion doped to define an active region, a source region and a drain region;

forming a gate insulating layer and a gate electrode respectively over the semiconductor film to form a semiconductor component;

forming the pixel electrode layer over the passivation layer;

connecting the pixel electrode layer to the semiconductor film;

forming the optical component over the semiconductor component and the pixel electrode;

bonding the second transfer substrate on top of the optical component;

applying heat on the back side of the first substrate to cause the sacrificial layer to crack when a hydrogen explosion occurs on an inner surface of the first substrate, such that the semiconductor and optical components formed thereon are transferred onto the second transfer substrate.

3. The method for fabricating a thin film transistor display device as claimed in claim 2, wherein an alignment layer is formed in between the sacrificial layer and the passivation layer.

4. The method for fabricating a thin film transistor display device as claimed in claim 3, wherein an etching stop layer is formed in between the alignment layer and the sacrificial layer.

5. The method for fabricating a thin film transistor display device as claimed in claim 2, wherein an etching stop layer is formed in between the sacrificial layer and the passivation layer.

6. The method for fabricating a thin film transistor display device as claimed in claim 2, wherein the bonding can be direct bonding, anode bonding, low temperature bonding, intermediate bonding, adhesive bonding, or laser melting.

7. The method for fabricating a thin film transistor display device as claimed in claim 1, wherein the fabrication process includes the steps of:

providing the first transfer substrate having a sacrificial layer on top;

forming an etching stop layer over the sacrificial layer;

forming a semiconductor film over the etching stop layer; wherein the semiconductor film is doped with ion to create a source and a drain region, and an active region;

forming a gate insulating layer and a gate electrode respectively over the semiconductor film;

forming the pixel electrode over the etching stop layer;

connecting the pixel electrode to the semiconductor film;

forming the optical component over the semiconductor component and the pixel electrode;

bonding a second transfer substrate on top of the optical component; and applying heat on the back side of the first substrate to cause the sacrificial layer to crack when a hydrogen explosion occurs on the inner surface of the first substrate, such that the semiconductor and optical components formed thereon are detached for transferring onto the second substrate.

8. The method for fabricating a thin film transistor display device as claimed in claim 7, wherein a alignment layer is formed over the etching stop layer.

9. The method for fabricating a thin film transistor display device as claimed in claim 7, wherein the bonding can be direct bonding, anode bonding, low temperature bonding, intermediate bonding, adhesive bonding, or laser melting.

10. The method for fabricating a thin film transistor display device as claimed in claim 1, wherein the fabrication process includes the steps of:

providing the first transfer substrate having a sacrificial layer on top;

forming an alignment layer over the sacrificial layer;

forming a semiconductor film over the alignment layer, wherein the semiconductor film is doped with ion to define a source and a drain region, and an active region;

forming a gate insulating layer and a gate electrode respectively over the semiconductor film to complete the fabrication of a semiconductor component;

forming the pixel electrode over the alignment layer;

connecting the semiconductor film and the pixel electrode;

forming then optical component over the semiconductor film and the pixel electrode;

bonding a second transfer substrate over the optical component; and applying heat on the back side of the first substrate to cause the sacrificial layer to crack when a hydrogen explosion occurs on the inner surface of the first substrate, such that the semiconductor and optical components formed thereon are detached for transferring onto the second substrate.

11. The method for fabricating a thin film transistor display device as claimed in claim 10, wherein an etching stop layer is formed in between the alignment layer and the sacrificial layer.

12. The method for fabricating a thin film transistor display device as claimed in claim 10, wherein the bonding can be direct bonding, anode bonding, low temperature bonding, intermediate bonding, adhesive bonding, or laser melting.

13. The method for fabricating a thin film transistor display device as claimed in claim 1, comprising the steps of:

providing the first transfer substrate having a sacrificial layer on top;

forming a semiconductor film over the sacrificial layer, wherein the semiconductor film is doped with ion to define a source and a drain region, and an active region;

forming a transparent dielectric layer over the semiconductor film and the sacrificial layer, wherein the gate insulating layer corresponds to the position of the semiconductor component;

forming a gate electrode over the gate insulating layer to complete the formation of a semiconductor component;

forming the pixel electrode over the transparent dielectric layer;

connecting the semiconductor film and the pixel electrode;

forming the optical component over the semiconductor component and the pixel electrode;

bonding a second transfer substrate over the optical component; and applying heat on the back side of the first substrate to cause the sacrificial layer to crack when a hydrogen explosion occurs on the inner surface of the first substrate, such that the semiconductor and optical components formed thereon are detached for transferring onto the second substrate.

14. The method for fabricating a thin film transistor display device as claimed in claim 13, wherein a passivation layer is formed over the sacrificial layer.

15. The method for fabricating a thin film transistor display device as claimed in claim 14, wherein the alignment layer is formed in between the passivation layer and the sacrificial layer.

16. The method for fabricating a thin film transistor display device as claimed in claim 15, wherein an etching stop layer is formed in between the alignment and the sacrificial layer.

17. The method for fabricating a thin film transistor display device as claimed in claim 13, wherein an alignment layer is formed over the sacrificial layer.

18. The method for fabricating a thin film transistor display device as claimed in claim 17, wherein an etching stop layer is formed in between the alignment layer and the sacrificial layer.

19. The method for fabricating a thin film transistor display device as claimed in claim 13, wherein the bonding can be direct bonding, anode bonding, low temperature bonding, intermediate bonding, adhesive bonding, or laser melting.

20. The method for fabricating a thin film transistor display device as claimed in claim 1, wherein the fabrication process includes the steps of:

providing the first transfer substrate having a sacrificial layer on top;

forming a passivation layer over the sacrificial layer;

forming semiconductor film over the passivation layer, wherein the semiconductor film is doped with ion to define a source and drain region, and an active region;

forming a gate insulating layer over the semiconductor film to complete the formation of a semiconductor component;

etching portions of the passivation layer to expose the sacrificial layer;

forming the pixel electrode over exposed sacrificial layer;

connecting the semiconductor film and the pixel electrode;

forming an optical component over the semiconductor component and the pixel electrode;

bonding a second transfer substrate on top of the optical component; and applying heat on the back side of the first substrate to cause the sacrificial layer to crack when a hydrogen explosion occurs on the inner surface of the first substrate, such that the semiconductor and optical components formed thereon are detached for transferring onto the second substrate.

21. The method for fabricating a thin film transistor display device as claimed in claim 20, wherein an etching stop layer is formed in between the pixel electrode and passivation and the sacrificial layer.

22. The method for fabricating a thin film transistor display device as claimed in claim 21, wherein an alignment layer is formed in between the etching stop layer and the sacrificial layer.

23. The method for fabricating a thin film transistor display device as claimed in claim 20, wherein an alignment layer is formed in between the pixel electrode and passivation and the sacrificial layer.

24. The method for fabricating a thin film transistor display device as claimed in claim 20, wherein the bonding can be direct bonding, anode bonding, low temperature bonding, intermediate bonding, adhesive bonding, or laser melting.

* * * * *